United States Patent
Zhu et al.

(10) Patent No.: US 12,245,390 B1
(45) Date of Patent: Mar. 4, 2025

(54) DOUBLE-LAYER RACK

(71) Applicants: SQ TECHNOLOGY(SHANGHAI) CORPORATION, Shanghai (CN); INVENTEC CORPORATION, Taipei (TW)

(72) Inventors: Kangguang Zhu, Shanghai (CN); Hong-Chou Lin, Taipei (TW); Yu-Fan Chen, Taipei (TW)

(73) Assignees: SQ TECHNOLOGY(SHANGHAI) CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 18/545,827

(22) Filed: Dec. 19, 2023

(30) Foreign Application Priority Data

Nov. 10, 2023 (CN) .......................... 202311502337.8

(51) Int. Cl.
| | |
|---|---|
| *G06F 1/16* | (2006.01) |
| *H05K 5/00* | (2006.01) |
| *H05K 5/02* | (2006.01) |
| *H05K 7/00* | (2006.01) |

(52) U.S. Cl.
CPC ................................. *H05K 5/0291* (2013.01)

(58) Field of Classification Search
CPC .. H05K 5/0291; H05K 5/0286; H05K 5/0282; H05K 5/0265; H05K 5/0269; H05K 5/026; H05K 5/0256; H05K 5/0217
See application file for complete search history.

(56) References Cited

U.S. PATENT DOCUMENTS

| | | | | |
|---|---|---|---|---|
| 10,624,226 | B1* | 4/2020 | Alvarado | H05K 7/1408 |
| 2003/0179560 | A1* | 9/2003 | Sivertsen | H05K 5/0291 |
| | | | | 361/796 |
| 2012/0155007 | A1* | 6/2012 | Zhang | H05K 5/0269 |
| | | | | 361/679.32 |
| 2017/0280578 | A1* | 9/2017 | Hesse | G06F 1/185 |
| 2021/0209718 | A1* | 7/2021 | Song | H05K 5/0026 |
| 2021/0410315 | A1* | 12/2021 | Pham | H05K 7/1489 |
| 2022/0057848 | A1* | 2/2022 | Chang | H05K 5/0265 |
| 2022/0061176 | A1* | 2/2022 | Ni | H05K 7/20727 |
| 2023/0324963 | A1* | 10/2023 | Wu | G06F 1/185 |
| 2024/0381556 | A1* | 11/2024 | Chien | H05K 5/03 |

* cited by examiner

*Primary Examiner* — Anthony M Haughton
(74) *Attorney, Agent, or Firm* — Maschoff Brennan

(57) ABSTRACT

A double-layer rack includes a PCIe card frame, a network card frame, a PCIe riser card and a network card connector assembly. The PCIe card frame is stacked on the network card frame. The network card frame has a network card accommodation space for selectively receiving one OCP network card, two OCP network cards or one data processing unit. The PCIe riser card is disposed in the PCIe accommodation space. The network card connector assembly is disposed in the network card accommodation space. The double-layer rack further includes a blocker component and a divider plate selectively and removably disposed on the network card frame, so that the network card accommodation space forms various accommodation space configurations for selectively receiving the one OCP network card, the two OCP network cards or the one data processing unit.

10 Claims, 12 Drawing Sheets

DOUBLE-LAYER RACK

CROSS-REFERENCE TO RELATED APPLICATIONS

This non-provisional application claims priority under 35 U.S.C. § 119 (a) on Patent Application No(s). CN,202311502337.8 filed in China on Nov. 10, 2023, the entire contents of which are hereby incorporated by reference.

TECHNICAL FIELD

This disclosure relates to a double-layer rack, more particularly to a double-layer rack configured for receiving various network cards or data processing units.

BACKGROUND

Data Processing Units (DPUs) are auxiliary computing devices used in servers and storage devices. DPUs are typically categorized into two major types which are I/O interface cards and computational storage devices. I/O interface cards are primarily in the form of expansion interface cards, while computational storage devices mainly consist of 2.5-inch SSDs or PCIe SSD cards. These two major types have different applications and characteristics. Among them, I/O interface cards can be further categorized into several types, such as intelligent network cards, server offload processors, and computational storage controllers. Regardless of the type, they are essentially PCIe interface cards provided with processing units and high-speed network ports and can be considered network cards with acceleration capabilities. Therefore, these I/O interface cards not only meet basic networking transmission needs but also provide offloading computational functions. On the other hand, computational storage controllers are provided with processing units and SSDs, allowing them to provide both offloading computational services and storage functions simultaneously.

In recent years, data processing units have undergone rapid development, and their outstanding performance has led to their widespread use in an increasing number of products and related applications. As a result, modern 2U servers commonly incorporate data processing units to enhance their computational and storage capabilities. Nevertheless, due to the unique needs of individual users, current data processing unit products primarily feature full-height, half-length (FHHL) PCIe cards in conjunction with modules like large form-factor open compute (LFF OCP) and small form-factor open compute (SFF OCP) network card modules. This fixed configuration approach necessitates product-specific design and production, often requiring the establishment of multiple production lines, making it challenging to switch between different modules based on specific requirements.

SUMMARY

The present disclosure is to provide a double-layer rack capable of addressing the problem where servers incorporating data processing unit products were unable to flexibly switch between different modules based on actual requirements.

One embodiment of the disclosure provides a double-layer rack including a PCIe card frame, a network card frame, a PCIe riser card and a network card connector assembly. The PCIe card frame has a PCIe accommodation space configured for receiving a PCIe-based card. The PCIe card frame is fixed to and stacked on the network card frame. The network card frame has a network card accommodation space configured for selectively receiving one OCP network card, two OCP network cards or one data processing unit. The PCIe riser card is disposed in the PCIe accommodation space, and configured to be electrically connected to the PCIe-based card. The network card connector assembly is disposed in the network card accommodation space, and configured to be electrically connected to the one OCP network card, the two OCP network cards or the one data processing unit. In addition, the double-layer rack further includes a blocker component and a divider plate, and the blocker component and the divider plate are selectively and removably disposed on the network card frame and located in the network card accommodation space, so that the network card accommodation space forms various accommodation space configurations for selectively receiving the one OCP network card, the two OCP network cards or the one data processing unit.

According to the double-layer rack as described above, by selectively and removably installing the blocker component and the divider plate onto the network card frame, various accommodation space configurations can be selectively formed within the network card accommodation space, allowing for the selective accommodation of one OCP network card, two OCP network cards or one data processing unit. Therefore, through the shared use of mold, different modules can be flexibly switched to meet customer requirements, adjusting the configuration of the product, which can facilitate reduced manufacturing costs and decreased time and expenses related to manual operation and maintenance.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Aspects and advantages of the invention will become apparent from the following detailed descriptions with the accompanying drawings. For purposes of explanation, one or more specific embodiments are given to provide a thorough understanding of the invention, and which are described in sufficient detail to enable one skilled in the art to practice the described embodiments. It should be understood that the following descriptions are not intended to limit the embodiments to one specific embodiment. On the contrary, it is intended to cover alternatives, modifications, and equivalents as can be included within the spirit and scope of the described embodiments as defined by the appended claims.

Figure 1:
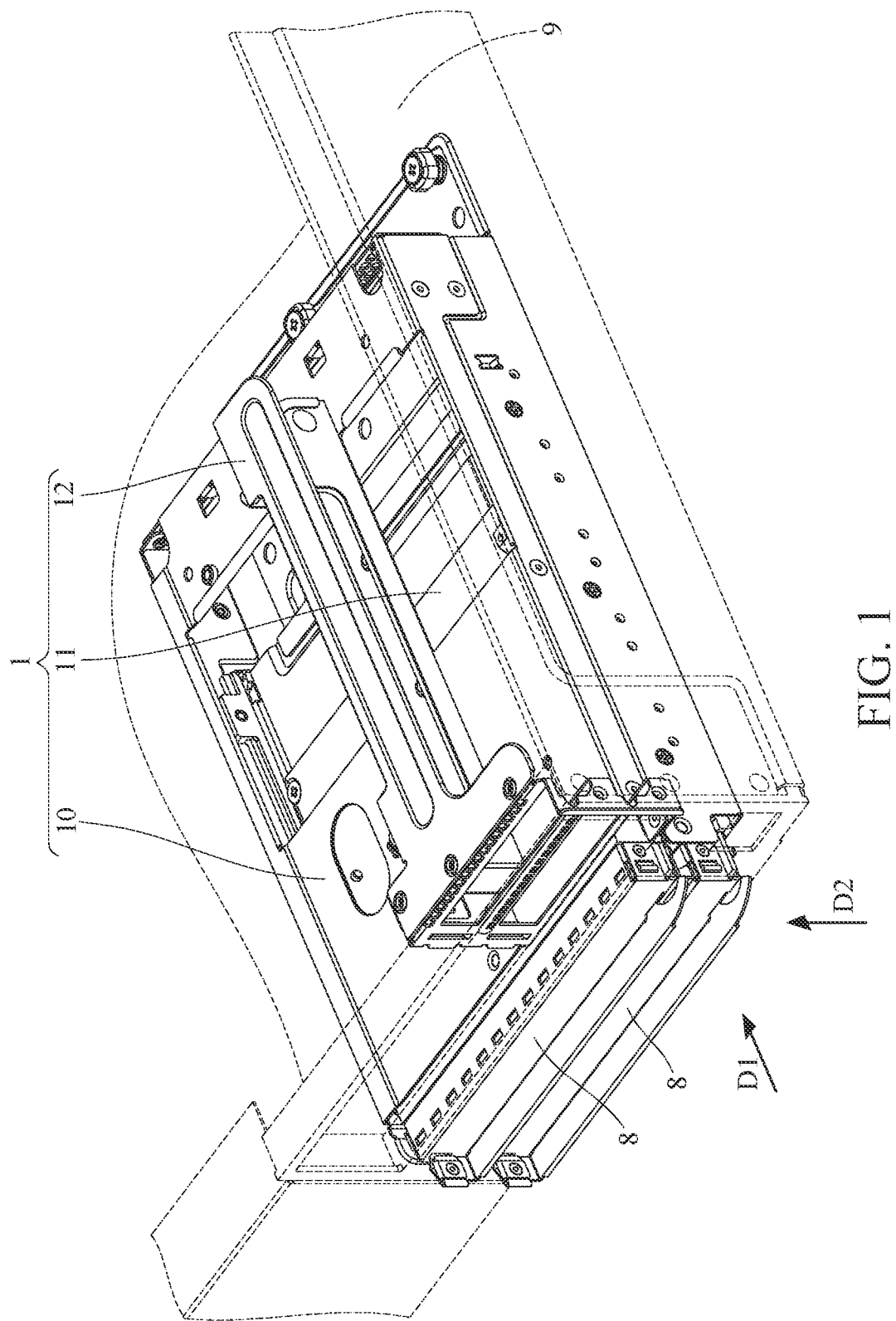
FIG. 1 is a perspective view of a double-layer rack receiving two LFF OCP network cards and fixed to a server case in accordance with a first embodiment of the disclosure.
Figure 2:
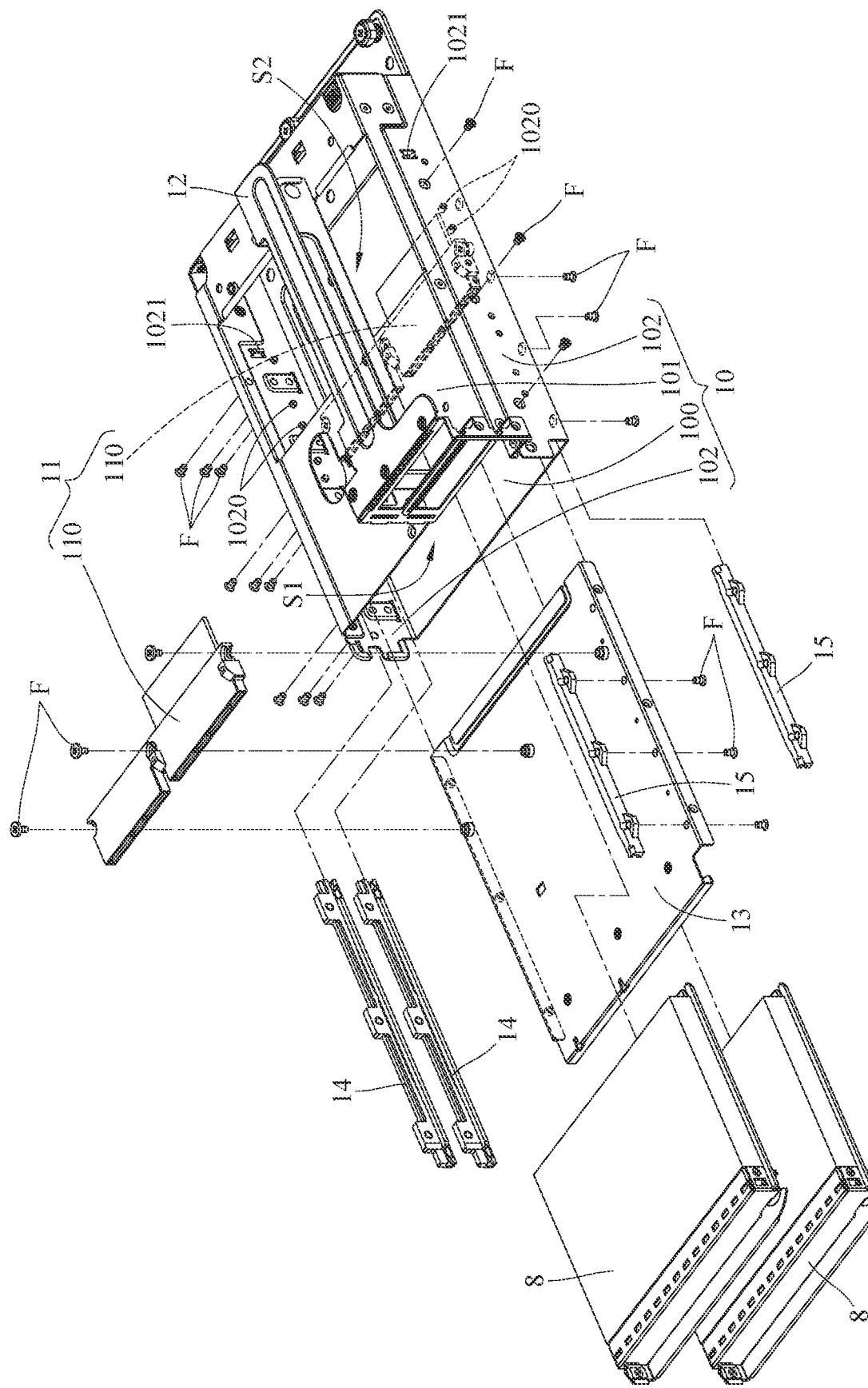
FIG. 2 is an exploded view of the double-layer rack and the LFF OCP network cards in FIG. 1.
Figure 3:
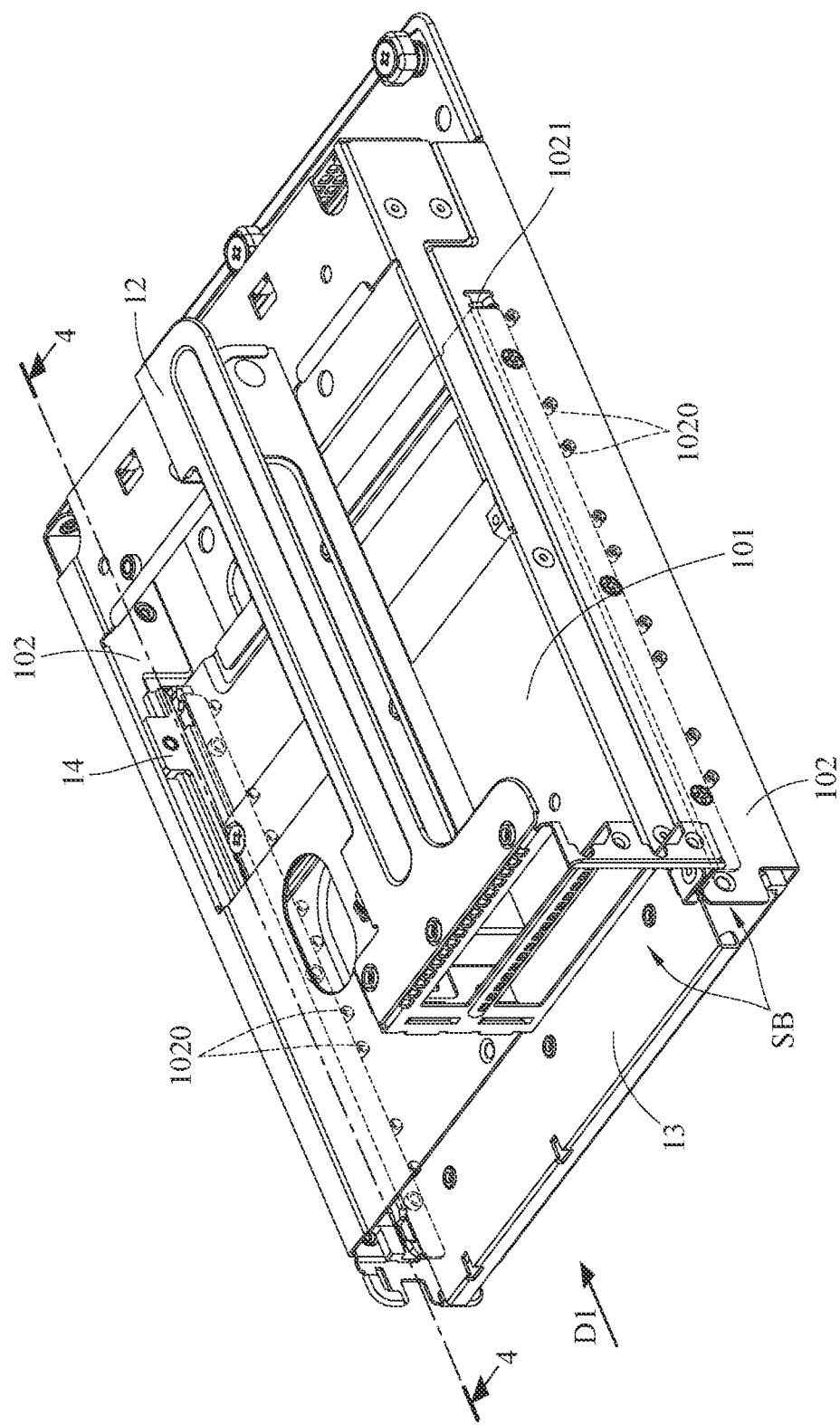
FIG. 3 is a perspective view of the double-layer rack in FIG. 1.
Figure 4:
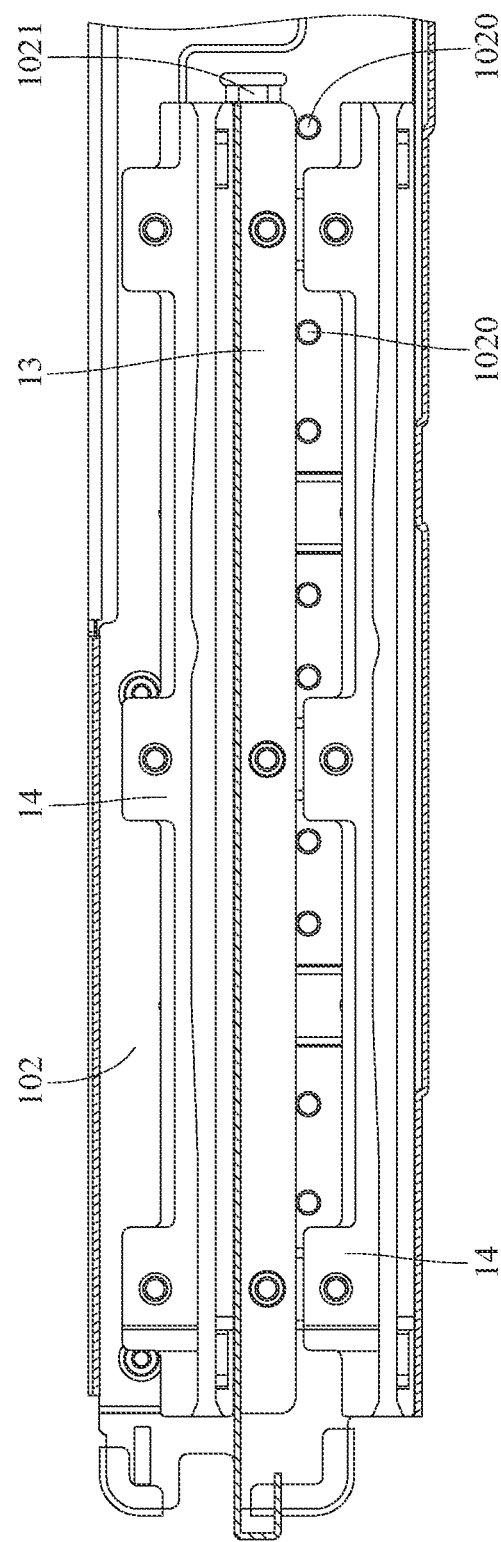
FIG. 4 is a cross-sectional view of the double-layer rack along line 4-4 in FIG. 3.

Please refer to FIG. 1 to FIG. 4. FIG. 1 is a perspective view of a double-layer rack receiving two LFF OCP network cards and fixed to a server case in accordance with a first embodiment of the disclosure, FIG. 2 is an exploded view of the double-layer rack and the LFF OCP network cards in FIG. 1, FIG. 3 is a perspective view of the double-layer rack in FIG. 1, and FIG. 4 is a cross-sectional view of the double-layer rack along line 4-4 in FIG. 3.

The double-layer rack 1 is configured to be fixed to a server case 9, and the double-layer rack 1 may have, for example, five accommodation space configurations configured for selectively receiving two LFF OCP network cards 8, two SFF OCP network cards 7, one LFF OCP network card 8, one SFF OCP network card 7 or one data processing unit 6. In the present disclosure, the above mentioned five accommodation space configurations are described in the first to fifth embodiments, respectively. One of the accommodation space configurations of the double-layer rack 1 for accommodating the two LFF OCP network cards 8 is firstly described in the first embodiment below The double-layer rack 1 includes a network card frame 10, a network card connector assembly 11, a PCIe card frame 12, a PCIe riser card (not shown in figures), a divider plate 13, two side guiding components 14 and two bottom guiding components 15.

The network card frame 10 has a network card accommodation space S1 configured for selectively receiving one OCP network card, two OCP network cards or one data processing unit. In detail, the network card frame 10 includes a bottom plate 100, a top plate 101 and two side plates 102. The bottom plate 100 and the top plate 101 are disposed opposite to each other, two opposite sides of the bottom plate 100 are connected to two opposite sides of the top plate 101 via the two side plates 102, respectively, and the bottom plate 100, the top plate 101 and the two side plates 102 together surround the network card accommodation space S1. In this embodiment, the network card accommodation space S1 is configured for receiving the two LFF OCP network cards 8.

The network card connector assembly 11 includes two network card connectors 110, and the two network card connectors 110 are located in the network card accommodation space S1, and configured to be electrically connected to the two LFF OCP network cards 8, respectively.

The PCIe card frame 12 is fixed to and stacked on the network card frame 10 via, for example, screws, and the PCIe card frame 12 has a PCIe accommodation space S2 configured for receiving one or more PCIe-based cards (not shown in figures).

The PCIe riser card is disposed on the PCIe card frame 12, and configured to be electrically connected to the PCIe-based card(s).

As shown in FIG. 4, each of the two side plates 102 of the network card frame 10 may have a plurality of protrusions 1020 and a stopper protruding block 1021 located in the network card accommodation space S1. The protrusions 1020 of each side plate 102 are arranged along an insertion direction D1 into the network card accommodation space S1, and the protrusions 1020 are configured to support and guide the divider plate 13 to move in the insertion direction D1. In each side plate 102, the stopper protruding block 1021 is located at one side of the protrusions 1020 so as to be in contact with the divider plate 13 and block the divider plate 13 in the insertion direction D1.

The divider plate 13 is located in the network card accommodation space S1 and removably fixed to the network card frame 10, and the network card accommodation space S1 is divided into two subspaces SB by the divider plate 13, and the two subspaces SB are configured for receiving the two LFF OCP network cards 8, respectively. In addition, the two LFF OCP network cards 8 are stacked on each other in a height direction D2 within the network card accommodation space S1.

During the installation of the divider plate 13 onto the network card frame 10, the divider plate 13 is inserted into the network card accommodation space S1 along the insertion direction D1, and a movement of the divider plate 13 in the network card accommodation space S1 is guided by the protrusions 1020. Then, the stopper protruding blocks 1021 block the divider plate 13 in the insertion direction D1 so as to position the divider plate 13 with in the network card accommodation space S1. Finally, the divider plate 13 can be secured to the network card frame 10 by screws F.

The two side guiding components 14 can be fixed to one of the side plates 102 by screws F and extend in the insertion direction D1, and the two side guiding components 14 are located in the two subspaces SB of the network card accommodation space S1, respectively. The two bottom guiding components 15 can be fixed to the bottom plate 100 and the divider plate 13 by screws F, respectively, and extend in the insertion direction D1, and the two bottom guiding components 15 are located in the two subspaces SB of the network card accommodation space S1, respectively. Furthermore, the side guiding component 14 and the bottom guiding component 15 located in the same subspace SB are configured to support and guide one of the LFF OCP network cards 8 to move in the insertion direction D1.

In this embodiment, the two network card connectors 110 of the network card connector assembly 11 can be fixed to the bottom plate 100 and the divider plate 13 by screws F, respectively. The two network card connectors 110 are located in the two subspaces SB of the network card accommodation space S1, respectively, and the two network card connectors 110 are configured to be electrically connected to the two LFF OCP network cards 8, respectively.

During the installation of the two LFF OCP network cards 8 into the network card accommodation space S1, the two LFF OCP network cards 8 are inserted into the two subspaces SB of the network card accommodation space S1 along the insertion direction D1, respectively, and a movement of the LFF OCP network cards 8 in the network card accommodation space S1 is guided by the side guiding components 14 and the bottom guiding components 15, allowing the two LFF OCP network cards 8 to be connected to the two network card connectors 110, respectively.

In this embodiment, a height of the PCIe accommodation space S2 is, for example, 1U, a height of the network card accommodation space S1 is, for example, 1U, and a height of each of the LFF OCP network cards 8 is, for example, smaller than half of the height of the network card accommodation space S1.

In this embodiment, each of the two side plates 102 has the stopper protruding block 1021, but the present disclosure is not limited thereto. In other embodiments, there may be only one side plate having the stopper protruding block.

Figure 5:
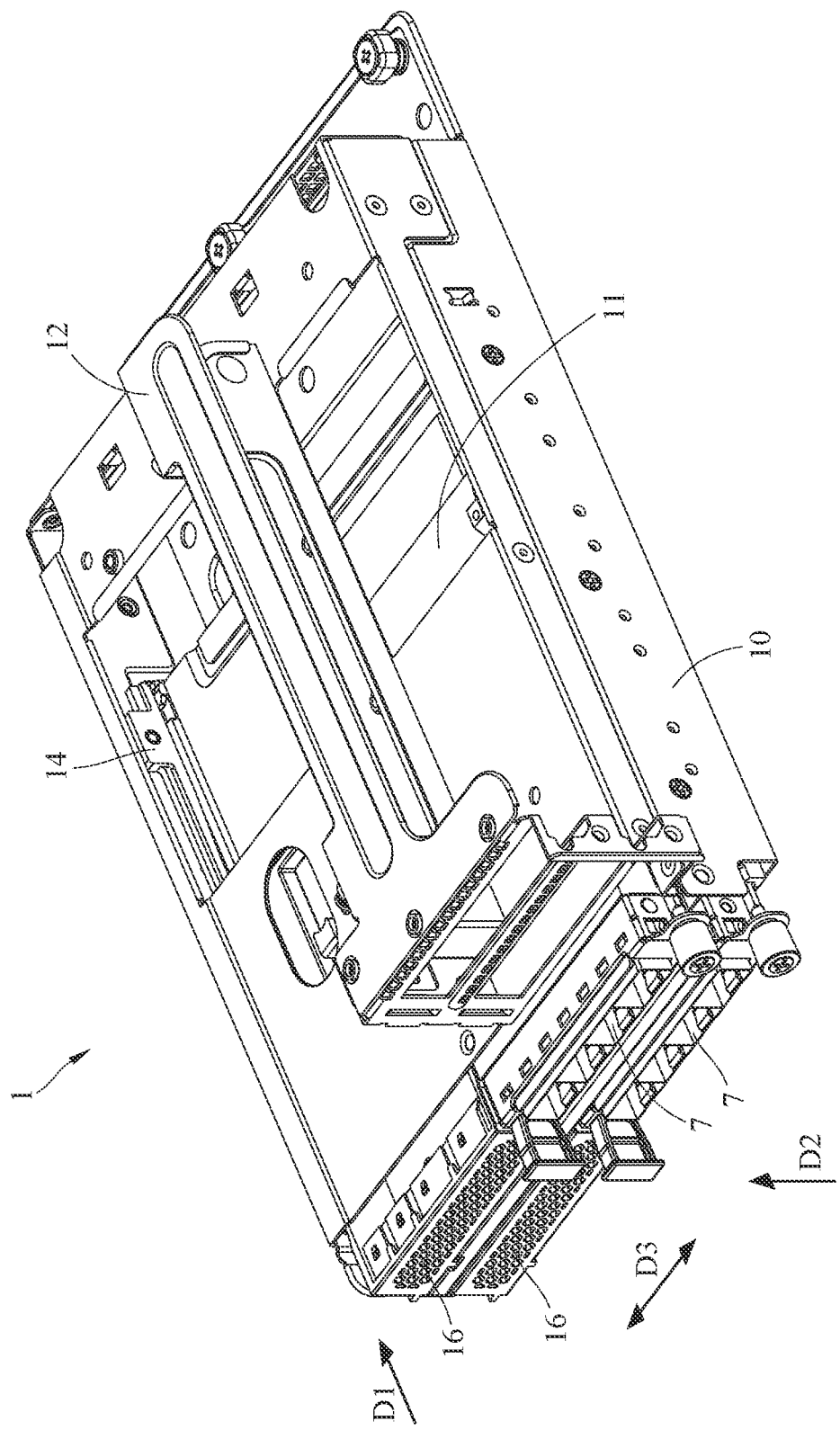
FIG. 5 is a perspective view of the double-layer rack receiving two SFF OCP network cards in accordance with a second embodiment of the disclosure.
Figure 6:
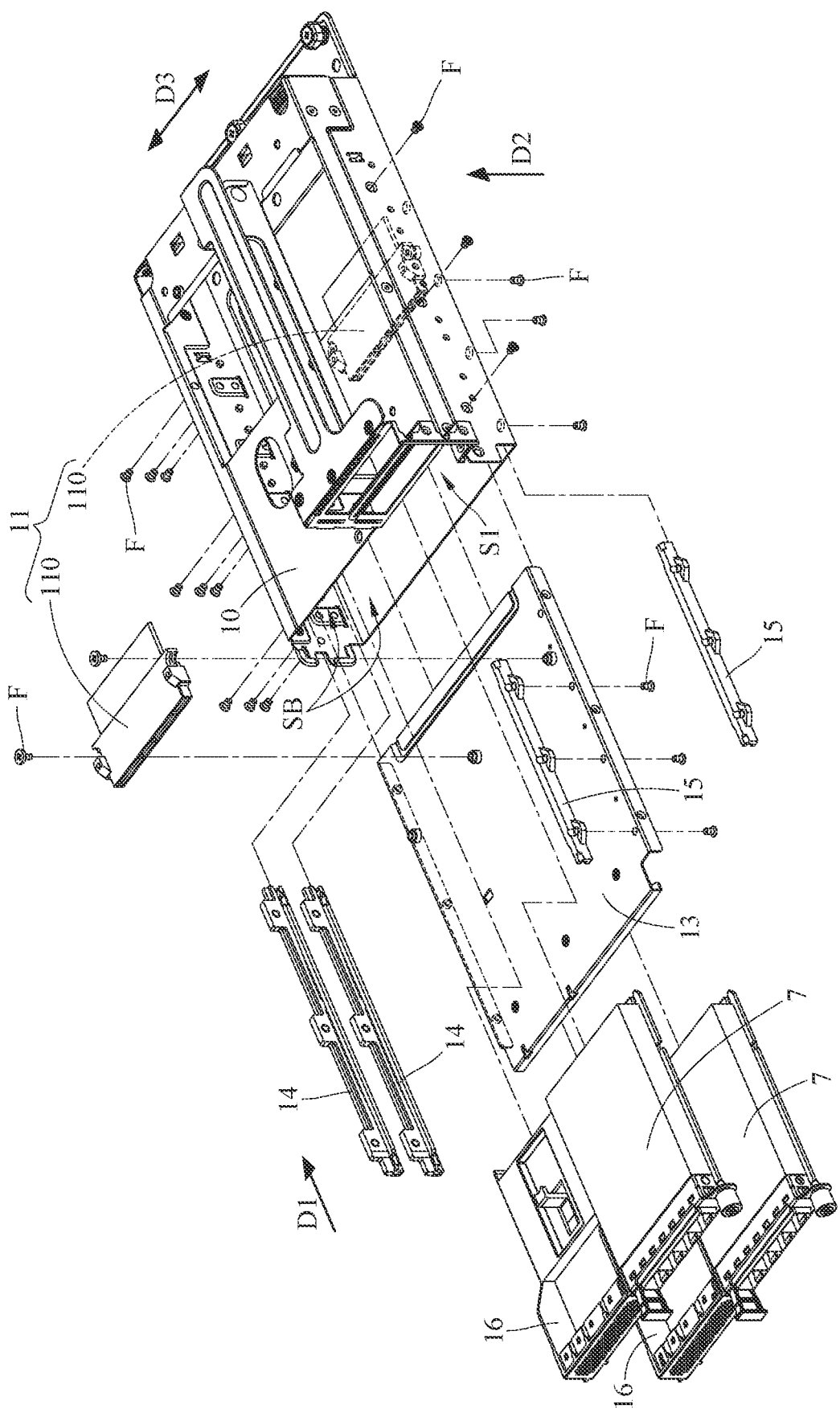
FIG. 6 is an exploded view of the double-layer rack and the SFF OCP network cards in FIG. 5.

Please refer to FIG. 5 and FIG. 6. FIG. 5 is a perspective view of the double-layer rack receiving two SFF OCP network cards in accordance with a second embodiment of the disclosure, and FIG. 6 is an exploded view of the double-layer rack and the SFF OCP network cards in FIG. 5.

In the second embodiment, the double-layer rack 1 has another accommodation space configuration for receiving the two SFF OCP network cards 7.

In the configuration of this embodiment, the double-layer rack 1 further includes two supporter frames 16 each configured to be connected to one of the two SFF OCP network cards 7 and separately accommodated in the two subspaces SB of the network card accommodation space S1 with their respective SFF OCP network cards 7. The supporter frame 16 and the SFF OCP network card 7 corresponding and connected thereto are arranged in parallel along a width direction D3 within the network card accommodation space S1. In other words, one pair of the supporter frame 16 and the SFF OCP network card 7 connected to each other is accommodated in one of the two subspaces SB, and the other pair of the supporter frame 16 and the SFF OCP network card 7 connected to each other is accommodated in the other of the two subspaces SB. Furthermore, the two SFF OCP network cards 7 are stacked on each other in the height direction D2 within the network card accommodation space S1, and the two SFF OCP network cards 7 are electrically connected to the two network card connectors 110 of the network card connector assembly 11, respectively.

During the installation of the two SFF OCP network cards 7 into the network card accommodation space S1, the two SFF OCP network cards 7 and the two supporter frames 16 are inserted into the two subspaces SB of the network card accommodation space S1 along the insertion direction D1, respectively, and a movement of the SFF OCP network cards 7 in the network card accommodation space S1 is guided by the side guiding components 14 and the bottom guiding components 15, allowing the two SFF OCP network cards 7 to be connected to the two network card connectors 110, respectively.

Connecting the supporter frame 16 to one side of the SFF OCP network card 7 ensures that a combined width of the SFF OCP network card 7 and the supporter frame 16 connected to each other matches a width of the network card accommodation space S1. Therefore, during the installation of the SFF OCP network card 7, one side of the supporter frame 16 located away from the SFF OCP network card 7 can be supported by the side guiding component 14, and one side of the SFF OCP network card 7 located away from the supporter frame 16 can be supported by the bottom guiding component 15, which ensures that the SFF OCP network card 7 and the supporter frame 16 can be supported and guided by both of the side guiding component 14 and the bottom guiding component 15 as the SFF OCP network card 7 and the supporter frame 16 are inserted into the network card accommodation space S1.

In this embodiment, the height of the PCIe accommodation space S2 is, for example, 1U, the height of the network card accommodation space S1 is, for example, 1U, and a height of each of the SFF OCP network cards 7 is, for example, smaller than half of the height of the network card accommodation space S1.

Figure 7:
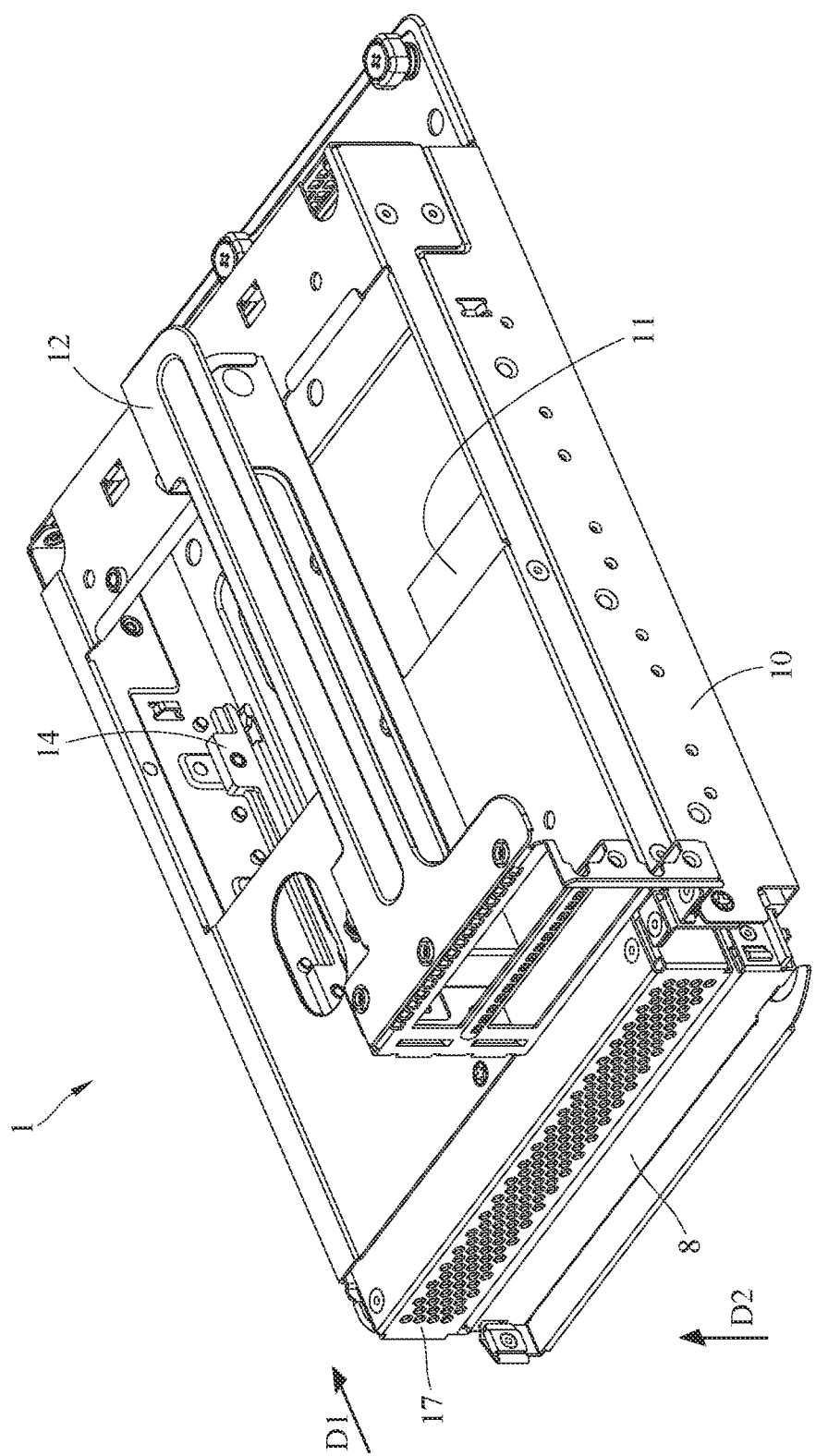
FIG. 7 is a perspective view of the double-layer rack receiving one LFF OCP network card in accordance with a third embodiment of the disclosure.
Figure 8:
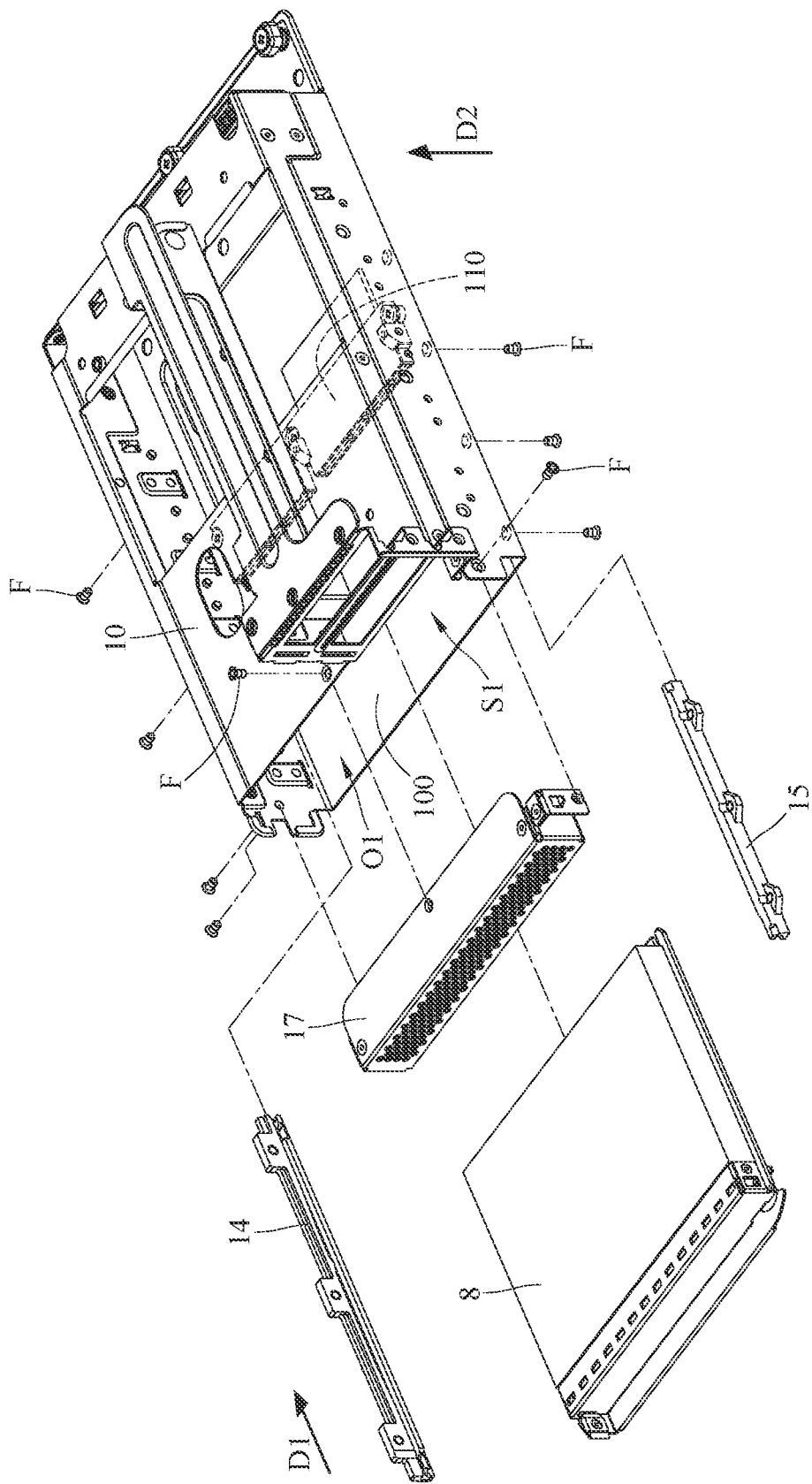
FIG. 8 is an exploded view of the double-layer rack and the LFF OCP network card in FIG. 7.

Please refer to FIG. 7 and FIG. 8. FIG. 7 is a perspective view of the double-layer rack receiving one LFF OCP network card in accordance with a third embodiment of the disclosure, and FIG. 8 is an exploded view of the double-layer rack and the LFF OCP network card in FIG. 7.

In the third embodiment, the double-layer rack 1 has another accommodation space configuration for receiving the one LFF OCP network card 8.

In the configuration of this embodiment, the double-layer rack 1 further includes a blocker component 17, and the divider plate 13 as described in the first embodiment is removed from the network card frame 10 of the double-layer rack 1. In addition, a quantity of the side guiding component 14, a quantity of the bottom guiding component 15 and a quantity of the network card connector 110 are one. That is, by selectively installing the blocker component 17 onto the network card frame 10, and removing the divider plate 13 from the network card frame 10 (i.e., without installing the divider plate 13), the double-layer rack 1 can form an accommodation space configuration for receiving the one LFF OCP network card 8. Moreover, quantities of the side guiding component 14 and the bottom guiding component 15 for guiding the one LFF OCP network card 8, and a quantity of the network card connector 110 for electrically connecting the one LFF OCP network card 8 are adjusted to match the accommodation space configuration.

The blocker component 17 can be fixed to the network card frame 10 by screws F and cover a part of an opening O1 of the network card accommodation space S1, and the blocker component 17 is configured to be stacked on the one LFF OCP network card 8 in the height direction D2 within the network card accommodation space S1. Therefore, the blocker component 17 can provide a dustproof effect.

In this embodiment, the network card connector 110 and the bottom guiding component 15 are fixed to the bottom plate 100.

During the installation of the one LFF OCP network card 8 into the network card accommodation space S1, the one LFF OCP network card 8 is inserted into the network card accommodation space S1 along the insertion direction D1, and a movement of the one LFF OCP network card 8 in the network card accommodation space S1 is guided by the side guiding component 14 and the bottom guiding component 15, allowing the one LFF OCP network card 8 to be connected to the network card connector 110.

Figure 9:
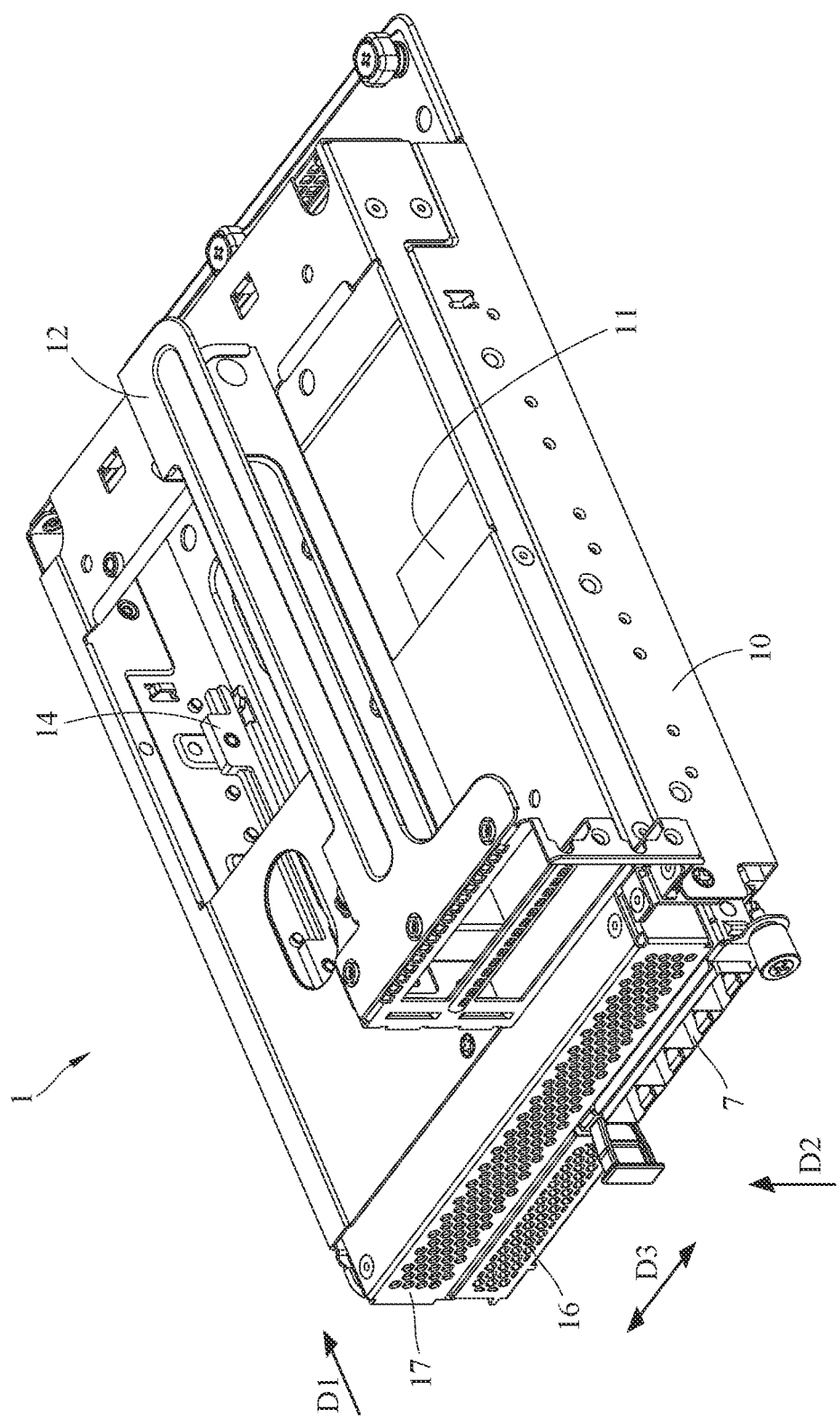
FIG. 9 is a perspective view of the double-layer rack receiving one SFF OCP network card in accordance with a fourth embodiment of the disclosure.
Figure 10:
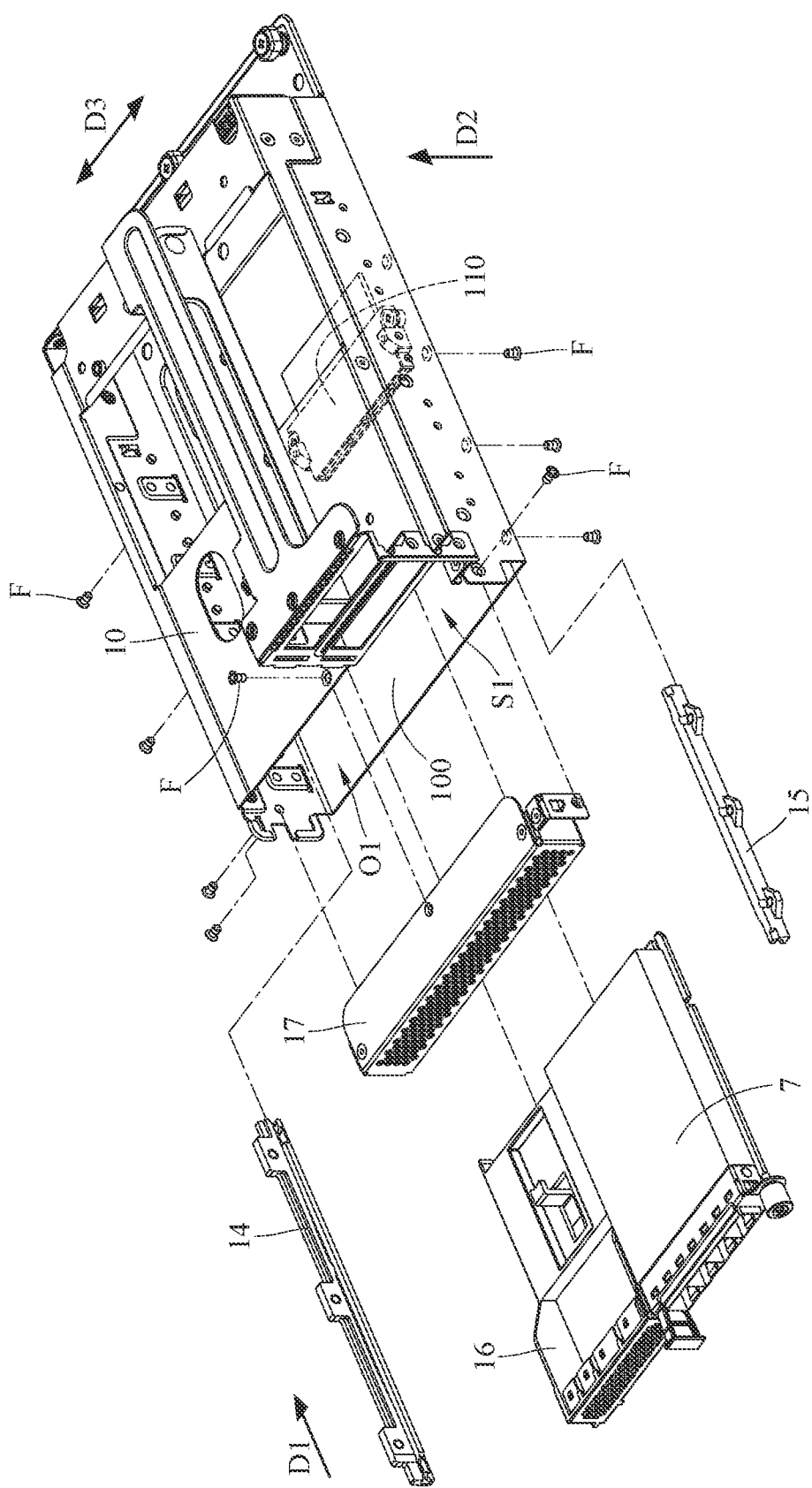
FIG. 10 is an exploded view of the double-layer rack and the SFF OCP network card in FIG. 9.

Please refer to FIG. 9 and FIG. 10. FIG. 9 is a perspective view of the double-layer rack receiving one SFF OCP network card in accordance with a fourth embodiment of the disclosure, and FIG. 10 is an exploded view of the double-layer rack and the SFF OCP network card in FIG. 9.

In the fourth embodiment, the double-layer rack 1 has another accommodation space configuration for receiving the one SFF OCP network card 7.

The accommodation space configuration in this embodiment is similar to that in the third embodiment, and the differences between them are in that in this embodiment, the double-layer rack 1 further includes a supporter frame 16 configured to be connected to the one SFF OCP network card 7 and accommodated in the network card accommodation space S1 with the one SFF OCP network card 7. Furthermore, the supporter frame 16 and the one SFF OCP network card 7 are arranged in parallel along the width direction D3 within the network card accommodation space S1.

The blocker component 17 is configured to be stacked on the one SFF OCP network card 7 in the height direction D2 within the network card accommodation space S1. Therefore, the blocker component 17 can provide a dustproof effect.

During the installation of the one SFF OCP network card 7 into the network card accommodation space S1, the one SFF OCP network card 7 is inserted into the network card accommodation space S1 along the insertion direction D1, and a movement of the supporter frame 16 and the one SFF OCP network card 7 in the network card accommodation space S1 is guided by the side guiding component 14 and the bottom guiding component 15, allowing the one SFF OCP network card 7 to be connected to the network card connector 110.

Figure 11:
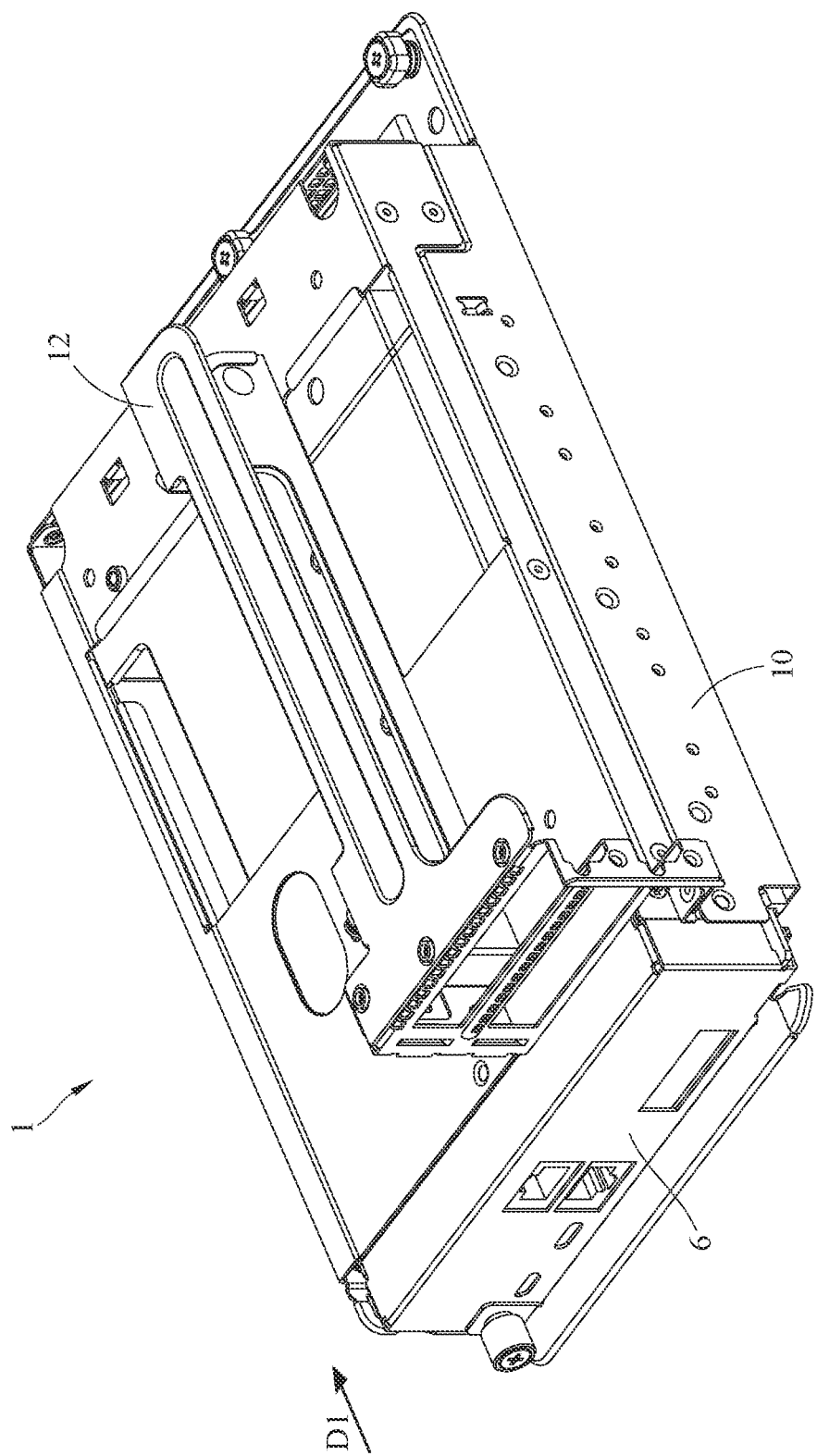
FIG. 11 is a perspective view of the double-layer rack receiving one data processing unit in accordance with a fifth embodiment of the disclosure.
Figure 12:
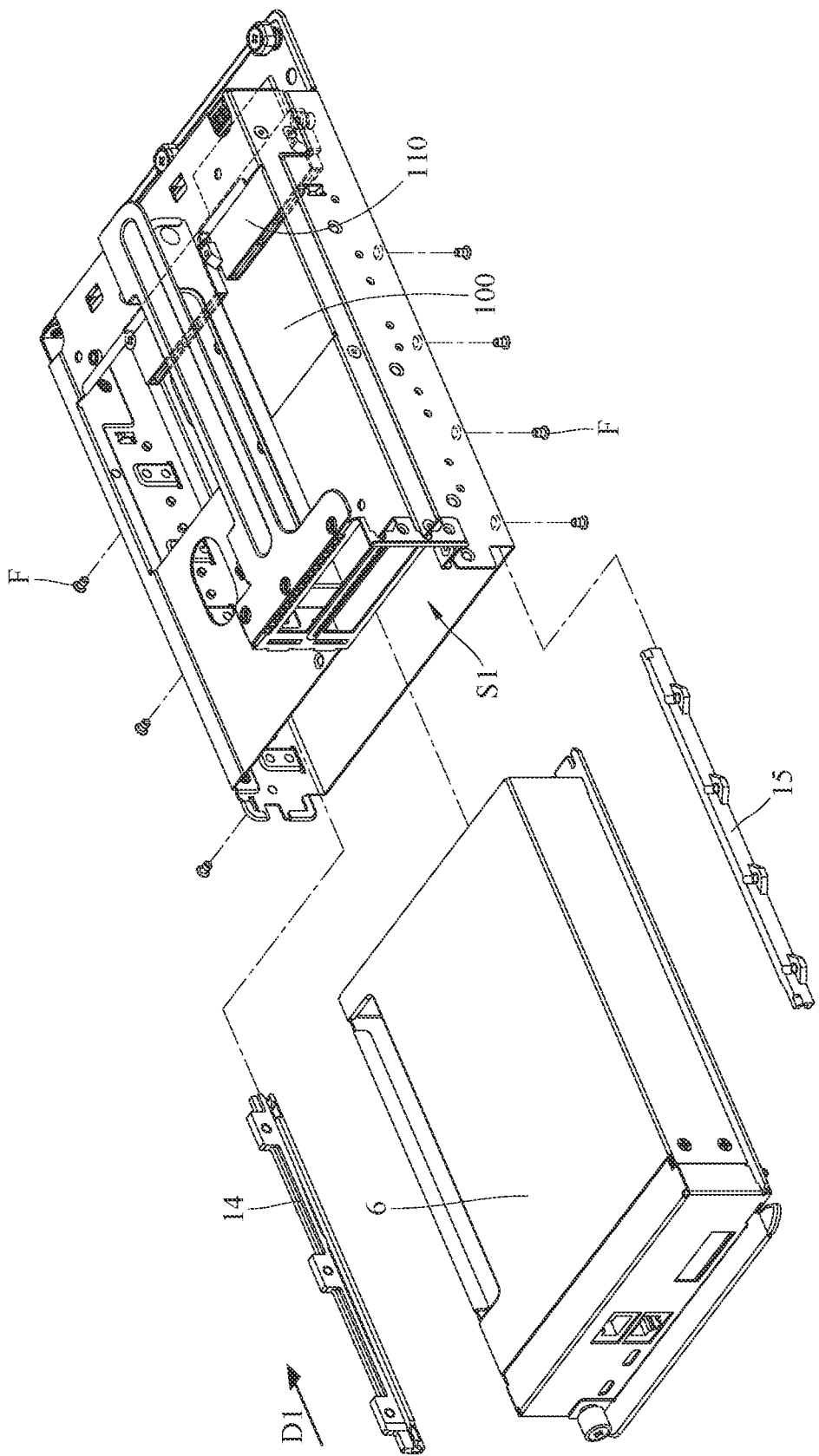
FIG. 12 is an exploded view of the double-layer rack and the data processing unit in FIG. 11.

Please refer to FIG. 11 and FIG. 12. FIG. 11 is a perspective view of the double-layer rack receiving one data processing unit in accordance with a fifth embodiment of the disclosure, and FIG. 12 is an exploded view of the double-layer rack and the data processing unit in FIG. 11.

In the fifth embodiment, the double-layer rack 1 has another accommodation space configuration for receiving the one data processing unit 6.

In the configuration of this embodiment, the divider plate 13 and blocker component 17 as described in the above embodiments are removed from the network card frame 10 of the double-layer rack 1, and the quantities of the side guiding component 14, the bottom guiding component 15 and the network card connector 110 are one. That is, by selectively removing the divider plate 13 and blocker component 17 from the network card frame 10 (i.e., without installing the divider plate 13 and blocker component 17), the double-layer rack 1 can form an accommodation space configuration for receiving the one data processing unit 6. Moreover, the quantities of the side guiding component 14 and the bottom guiding component 15 for guiding the one data processing unit 6, and the quantity of the network card connector 110 for electrically connecting the one data processing unit 6 are adjusted to match the accommodation space configuration.

In this embodiment, the network card connector 110 and the bottom guiding component 15 are fixed to the bottom plate 100.

During the installation of the one data processing unit 6 into the network card accommodation space S1, the one data processing unit 6 is inserted into the network card accommodation space S1 along the insertion direction D1, and a movement of the one data processing unit 6 in the network card accommodation space S1 is guided by the side guiding component 14 and the bottom guiding component 15, allowing the one data processing unit 6 to be connected to the network card connector 110.

According to the double-layer rack as described above, by selectively and removably installing the blocker component and the divider plate onto the network card frame, various accommodation space configurations can be selectively formed within the network card accommodation space, allowing for the selective accommodation of one OCP network card, two OCP network cards or one data processing unit. Therefore, through the shared use of mold, different modules can be flexibly switched to meet customer requirements, adjusting the configuration of the product, which can lead to reduced manufacturing costs and decreased time and expenses related to manual operation and maintenance.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A double-layer rack comprising:
    a PCIe card frame having a PCIe accommodation space configured for receiving a PCIe-based card;
    a network card frame, wherein the PCIe card frame is fixed to and stacked on the network card frame, and the network card frame has a network card accommodation space configured for selectively receiving one OCP network card, two OCP network cards or one data processing unit;
    a PCIe riser card disposed on the PCIe card frame, and the PCIe riser card configured to be electrically connected to the PCIe-based card; and
    a network card connector assembly disposed in the network card accommodation space, and the network card connector assembly configured to be electrically connected to the one OCP network card, the two OCP network cards or the one data processing unit;
    wherein the double-layer rack further comprises a blocker component and a divider plate, the blocker component and the divider plate are selectively and removably disposed on the network card frame and located in the network card accommodation space, so that the network card accommodation space forms various accommodation space configurations for selectively receiving the one OCP network card, the two OCP network cards or the one data processing unit.

2. The double-layer rack according to claim 1, wherein when the network card accommodation space is configured for receiving the one OCP network card, the blocker component is fixed to the network card frame and covers a part of the network card accommodation space, and the blocker component is configured to be stacked on the one OCP network card in a height direction within the network card accommodation space.

3. The double-layer rack according to claim 1, wherein when the network card accommodation space is configured for receiving the two OCP network cards, the divider plate is located in the network card accommodation space and fixed to the network card frame, the network card accommodation space is divided into two subspaces by the divider plate, the two subspaces are configured for receiving the two OCP network cards, respectively, and the two OCP network cards are stacked on each other in a height direction within the network card accommodation space.

4. The double-layer rack according to claim 1, wherein the OCP network card is a LFF OCP network card or a SFF OCP network card.

5. The double-layer rack according to claim 4, further comprising at least one supporter frame, wherein when the network card accommodation space is configured for receiving the one SFF OCP network card, the at least one supporter frame is configured to be connected to the one SFF OCP network card, the at least one supporter frame and the one SFF OCP network card are together accommodated in the network card accommodation space, and the at least one supporter frame and the one SFF OCP network card are arranged in parallel along a width direction within the network card accommodation space.

6. The double-layer rack according to claim 1, further comprising at least one side guiding component and at least one bottom guiding component, wherein the network card frame comprises a bottom plate, a top plate and two side plates, the bottom plate and the top plate are disposed opposite to each other, two opposite sides of the bottom plate are connected to two opposite sides of the top plate via the two side plates, respectively, the bottom plate, the top plate and the two side plates together surround the network card accommodation space, the at least one side guiding component is fixed to one of the side plates and extends in an insertion direction into the network card accommodation space, the at least one bottom guiding component is fixed to the bottom plate and the divider plate and extends in the insertion direction, and the at least one side guiding component and the at least one bottom guiding component are configured to support and guide the one OCP network card, the two OCP network cards or the one data processing unit to move in the insertion direction.

7. The double-layer rack according to claim 6, wherein when the network card accommodation space is configured for receiving the two OCP network cards, the at least one side guiding component comprises two side guiding components, the at least one bottom guiding component comprises two bottom guiding components, one of the two bottom guiding components is fixed to the bottom plate, and other of the two bottom guiding components is fixed to the divider plate.

8. The double-layer rack according to claim 1, wherein the network card frame comprises a bottom plate, a top plate and two side plates, the bottom plate and the top plate are disposed opposite to each other, two opposite sides of the bottom plate are connected to two opposite sides of the top plate via the two side plates, respectively, the bottom plate, the top plate and the two side plates together surround the network card accommodation space, each of the two side plates has a plurality of protrusions located in the network card accommodation space, the plurality of protrusions of each of the side plates are arranged along an insertion direction into the network card accommodation space, and the plurality of protrusions are configured to support and guide the divider plate to move along the insertion direction.

9. The double-layer rack according to claim 8, wherein at least one of the two side plates further has a stopper protruding block located in the network card accommodation space, and the stopper protruding block is configured to be in contact with the divider plate and block the divider plate in the insertion direction.

10. The double-layer rack according to claim 1, wherein a height of the network card accommodation space is 1U, a height of the one data processing unit is 1U, and a height of the one OCP network card is smaller than half of the height of the network card accommodation space.

\* \* \* \* \*